(12) United States Patent
Commons et al.

(10) Patent No.: US 6,440,759 B1
(45) Date of Patent: Aug. 27, 2002

(54) METHOD OF MEASURING COMBINED CRITICAL DIMENSION AND OVERLAY IN SINGLE STEP

(75) Inventors: Martin Commons, Stormville, NY (US); Tobias Mono, Dresden (DE); Velt Klee, Pleasant Valley, NY (US); John Pohl, Stoneygate (GB); Paul Wensley, Poughquag, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/893,475

(22) Filed: Jun. 29, 2001

(51) Int. Cl.$^7$ ............................................. H01L 21/00
(52) U.S. Cl. ............................... 438/7; 438/16; 438/401
(58) Field of Search ........................... 438/5, 7, 14, 16, 438/17, 401

(56) References Cited

U.S. PATENT DOCUMENTS

| | | | |
|---|---|---|---|
| 5,555,319 A | 9/1996 | Tsubusaki et al. | 382/170 |
| 5,701,013 A | 12/1997 | Hsia et al. | 250/491.1 |
| 5,847,818 A | 12/1998 | Lin et al. | 356/124.5 |
| 5,926,690 A * | 7/1999 | Toprac et al. | 438/17 |
| 6,054,710 A | 4/2000 | Bruggeman | 250/307 |
| 6,368,879 B1 * | 4/2002 | Toprac | 438/5 |
| 6,388,253 B1 * | 5/2002 | Su | 438/14 |
| 2001/0003673 A1 * | 6/2001 | Yu et al. | 438/706 |

* cited by examiner

*Primary Examiner*—Chandra Chaudhari
(74) *Attorney, Agent, or Firm*—Stanton Braden

(57) ABSTRACT

A semiconductor wafer structure in a overlay pattern that permits determination of overlay and critical dimension features by CD SEM in a single pass along a given axis, comprising:

a) a center feature section that provides a critical dimension point along a given axis;

b) plurality of smaller sections positioned adjacent to the center feature section along the given axis that include a plurality of spaces between each of the plurality of smaller sections; and c) a plurality of displacement lines adjacent to the plurality of the smaller sections to displace a plurality of spaces.

9 Claims, 2 Drawing Sheets

METHOD OF MEASURING COMBINED CRITICAL DIMENSION AND OVERLAY IN SINGLE STEP

BACKGROUND OF THE INVENTION

1. Field of Invention

The present invention relates to a method for concurrently measuring Critical Dimension (CD) and overlay structures on a semiconductor chip by combining the structures into a single feature to enable measurements to be made in a single pass in the CD scanning electron microscope (SEM).

2. Description of the Prior Art

In producing semiconductor devices that are of Large Scale Integration (LSI) and Very Large Scale Integration (VLSI), extremely complex electrical circuits are fabricated on a chip of silicon. This fabrication has occasioned substantial reductions in the size of circuit dimensions and thereby altered the manufacturing requirements of the semiconductor devices.

In the manufacturing process, photolithography is typically utilized to transfer a microscopic pattern from a photomask to the silicon wafer surface of an integrated circuit. The typical photolithographic system employs a step-and-repeat process that transfers the mask pattern from a macroscopic prototype to the silicon wafer. The process entails numerous iterations of individual reductions, and each individual reduction may introduce errors into the final device. Conventional means for monitoring and correcting these errors fail to provide the necessary resolution and measurement accuracy when employed with extremely small chip designs necessitated by the required reductions.

By increasing the number of components in semiconductor structures, integrated circuit configurations have developed into complex three dimensional topographies.

As the device dimensions continue to be reduced, the requirement for overlay measurement accuracy continues to increase. In general, for a 0.25 μm design rule, the overlay specification is in the range of about 0.025 μm. Consequently, overlay measurements have to utilize SEM (scanning electron microscopy) techniques to verify measurement accuracy).

One conventional wafer product overlay measurement technique employs test mask targets (i.e., box-in-box and critical dimension (CD) in different areas of the wafer, where these structures are layed out in the peripheral regions of the chip. These measurements compare shifts in the box centerlines in order to obtain a process average. However, with this conventional technique, the disposition of the dimensional quality or diagnostics is not capable of being determined until both the box-in-box and critical dimension targets are taken on a significant number of cells within the device. In other words, since this process requires two sets of measurement steps, and a comparison between the measurements, the method is unwieldly. Further, this conventional diagnostic process is more exaggerated with increased density of devices and thereby impedes the automated fabrication process.

U.S. Pat. No. 5,555,319 disclose critical dimension measuring methods and equipment therefor. The measuring equipment comprises:

irradiating means for irradiating an electron beam onto a measured pattern to be measured;

detecting means for detecting a secondary and reflected electron reflected from the measured pattern;

filtering means for receiving image data as the secondary and reflected electron detected by the detecting means and implementing a spatial filtering processing of the image data and storing the result of the spatial filtering processing into a first memory;

histogram processing means for receiving the image data which had been obtained after the spatial filtering processing stored in the first memory, implementing histogram processing of the image data, and storing the result of the histogram processing into a second memory;

threshold value detection means for receiving the result of the histogram processing stored in the second memory, generating a threshold value by automatically separating classes in a histogram obtained by the histogram processing based on the discriminant criteria method, and storing the result generated by the threshold value detection means into a third memory;

three-value conversion processing means for receiving the threshold value stored in the third memory, implementing three-value conversion of the image data stored in the first memory obtained after special filtering processing based on the threshold value, and storing the result obtained by the three-value conversion means into a fourth memory.

first calculation means for receiving image data stored in the forth memory obtained after three-value conversion processing, obtaining the area and perimeter of the bottom section of the pattern based on this data, and storing the result obtained by the first calculation means into a fifth memory;

second calculation means for receiving the area and the perimeter of the bottom section of the pattern stored in the fifth memory, obtaining the diameters of the patterns based on this data, and storing the result obtained by the second calculation means into a sixth memory; and pattern shape recognition means for automatically deciding whether the pattern is circular or elliptical based on the pattern diameter stored in the sixth memory, calculating the diameter of the circle based on the area if the pattern is circular, and calculating a major axis and a minor axis of the ellipse based on the area and the perimeter if the pattern is elliptical.

A CD vernier apparatus for SEM CD measurements is disclosed in U.S. Pat. No. 5,847,818. The apparatus comprises:

a central strip pattern disposed along a specific direction;

a first plurality of strip patterns disposed in parallel, along the specific direction, and on a first side adjacent to the central strip;

a second plurality of strip patterns disposed in parallel, along the specific direction, and on a second side adjacent to the central strip pattern;

a plurality of recognition patterns selectively added to the first plurality of strip patterns and to the second plurality of strip patterns;

wherein the number of strip patterns of the first plurality equals that of the number of strip patterns of the second plurality, each strip pattern having an equal length which is shorter than the length of the central strip pattern but is longer than the length of the recognition patterns, and wherein one end of the central strip pattern, one end of each strip pattern of the first plurality and one end of each strip pattern of the second plurality all being aligned on a base line, whereby the central strip pattern, the recognition patterns, the first plurality and the second plurality form a specific figure to serve as a critical dimension vernier pattern.

A method of apparatus for obtaining two or three dimensional information from scanning electron microscopy is disclosed in U.S. Pat. No. 6,054,710. The method comprises:

collecting a first measurement of a first semiconductor structure from a scanning electron microscope;

collecting a second measurement of the first semiconductor structure from an atomic force microscope;

establishing a relationship between the first measurement and the second measurement of the first semiconductor structure wherein the relationship indicates the second measurement if a third measurement from a scanning electron microscope of a second semiconductor structure has characteristics similar to the first semiconductor structure; and mapping a two dimensional waveform through a multi-dimensional decision space to a corresponding three dimensional characteristic using a parallel distributed process operationally connected to an output of the scanning electron microscope, the parallel distributed process containing coefficients that provide the multi-dimensional mapping space for the output of the scanning electron microscope to map to an output value that provides information on the critical dimension of the semiconductor structure.

U.S. Pat. No. 5,701,013 disclose a wafer metroloty pattern for use in a critical dimension analysis of a semiconductor configuration comprising:

a first central section for providing a central reference point;

a plurality of sections positioned concentrically around the central section including a plurality of spaces between each of the plurality of sections; and a plurality of compensating lines positioned radially about at least to particular plurality of the sections to compensate for the plurality of spaces.

There is a need in the art of measuring CD and overlay structures during manufacturing of semiconductor devices, where both CD and overlay measurement calculations are based on the estimation of a resist/feature edge to make a measurement, to be able to combine the structures into a single feature to permit the CD and overlay measurement to be made in a single pass in the CD SEM.

SUMMARY OF THE INVENTION

One object of the present invention is to provide methods for combining CD and overlay structures during manufacturing of semiconductor devices into a single feature.

Another object of the present invention is to provide methods for combining the CD structure and overlay structure into a single feature during manufacturing of semiconductor devices to permit the CD and overlay measurements to be made in a single pass in the CD SEM.

A further object of the present invention is to provide methods for measuring the structures of a CD and overlay by combining the measure of structures into a single feature based upon the estimation of the resist/feature edge to permit the CD and overlay measurement to be made in a single pass in the CD SEM, by utilizing an X pass and Y pass to provide overlay in two directions with a single tool.

DETAILED DESCRIPTION OF PREFERRED EMBODIMENT OF THE INVENTION

In the manufacture of a semiconductor wafer, the structure under consideration has a critical dimension (CD), such as its width.

The critical dimension is a factor which identifies or defines the minimum physical dimension for a semiconductor structure to ensure reliability and performance, which is used to determine the quality of the fabrication process. The present invention provides a new CD/overlay structure in which a single pass in a SEM provides intensity data for both CD and overlay measurements in the X component.

Figures 1A, 1B:
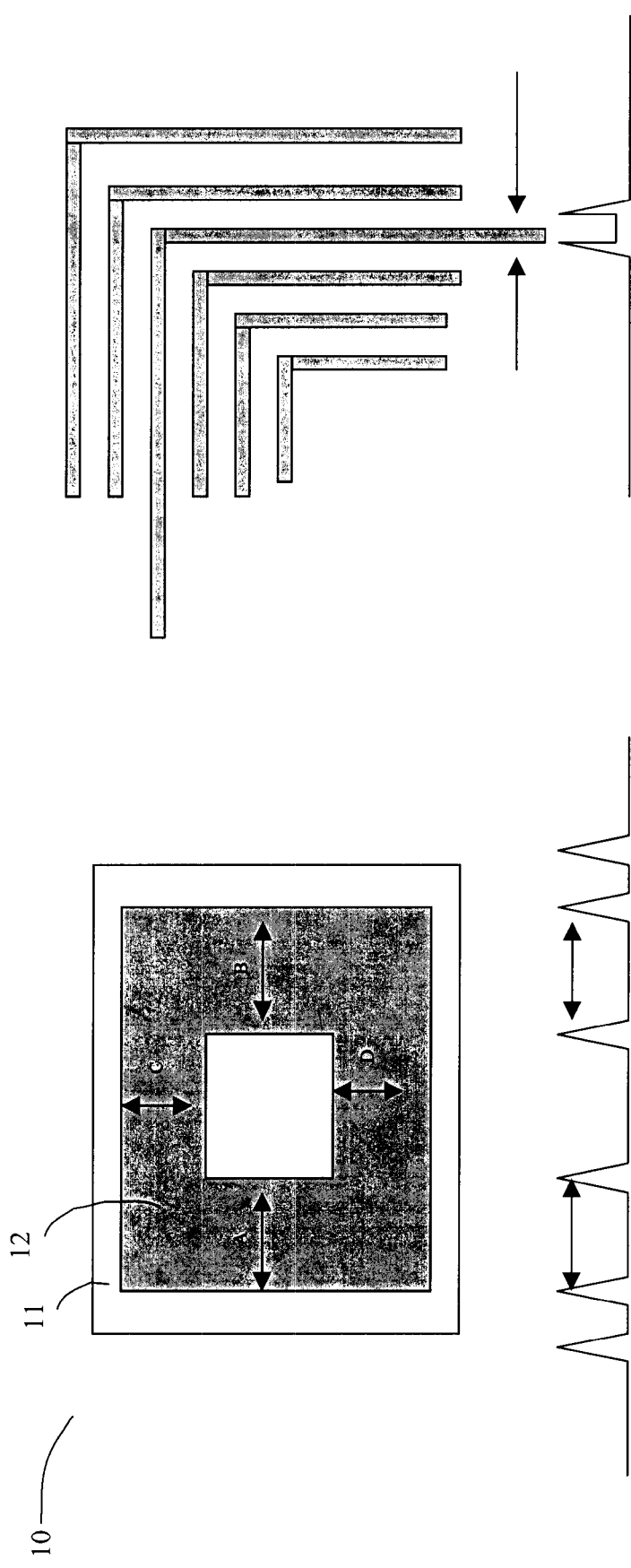
FIG. 1a is a conceptualized depiction of a diagram showing current CD/overlay methods to pick resist and feature edges to calculate overlay.
FIG. 1b is a conceptualized depiction of current CD/overlay methods in which CD SEM utilizes intensity of resist edges to calculate CD.

To facilitate easier grasp of the new CD/overlay structure of the invention, reference is made to FIG. 1a which is a conceptualized depiction of a diagram showing current CD/overlay methods to select resist and feature edges to calculate overlay. As may be seen from this figure, the optical overlay tool uses the intensity shown by the peak in the waveform to identify resist and feature edges to calculate the overlay. This wafer metrology pattern 10 is a box-in-box pattern comprising an overlay 11 and an overlay 12. The overlay 11 has a width, and similarly, the overlay 12 has a width. Also, the overlay box-in-box pattern is characterized by resist and feature edges, and these edges may be used to verify measurement accuracy. For example, a two-dimensional length measuring system which detects a change in resonance of a vibrating probe tip as it approaches the surface may be used, and this probe tip may be vibrated in either the horizontal or the vertical direction, depending upon which surface is being measured. The resist and feature edges are determined by using two passes of the probe to calculate the overlay. To calculate along the X axis, for example, X=A−B, and to calculate along the Y axis, Y=C−D.

The output waveform from the probe of the structure under test is shown in the waveform in FIG. 1a, where the intensity or peak of the waveform identifies resist and feature edges of the overlay. Again, two passes are required to calculate X=(A−B) and Y=(C−D).

Due to the limitations of the measurement devices in the box-in-box metrology pattern 10 in FIG. 1a, this pattern cannot be used for critical dimension disposition requiring lines smaller than those of overlays 11 and 12.

As can be seen from FIG. 1b, the CD SEM of the existing wafer metrology patterns from FIG. 1a uses intensity of resist edges to calculate CD, and the intensity is shown by the peaks in the output waveform of the scanning probe at the bottom of the diagram of FIG. 1b.

Figure 2:
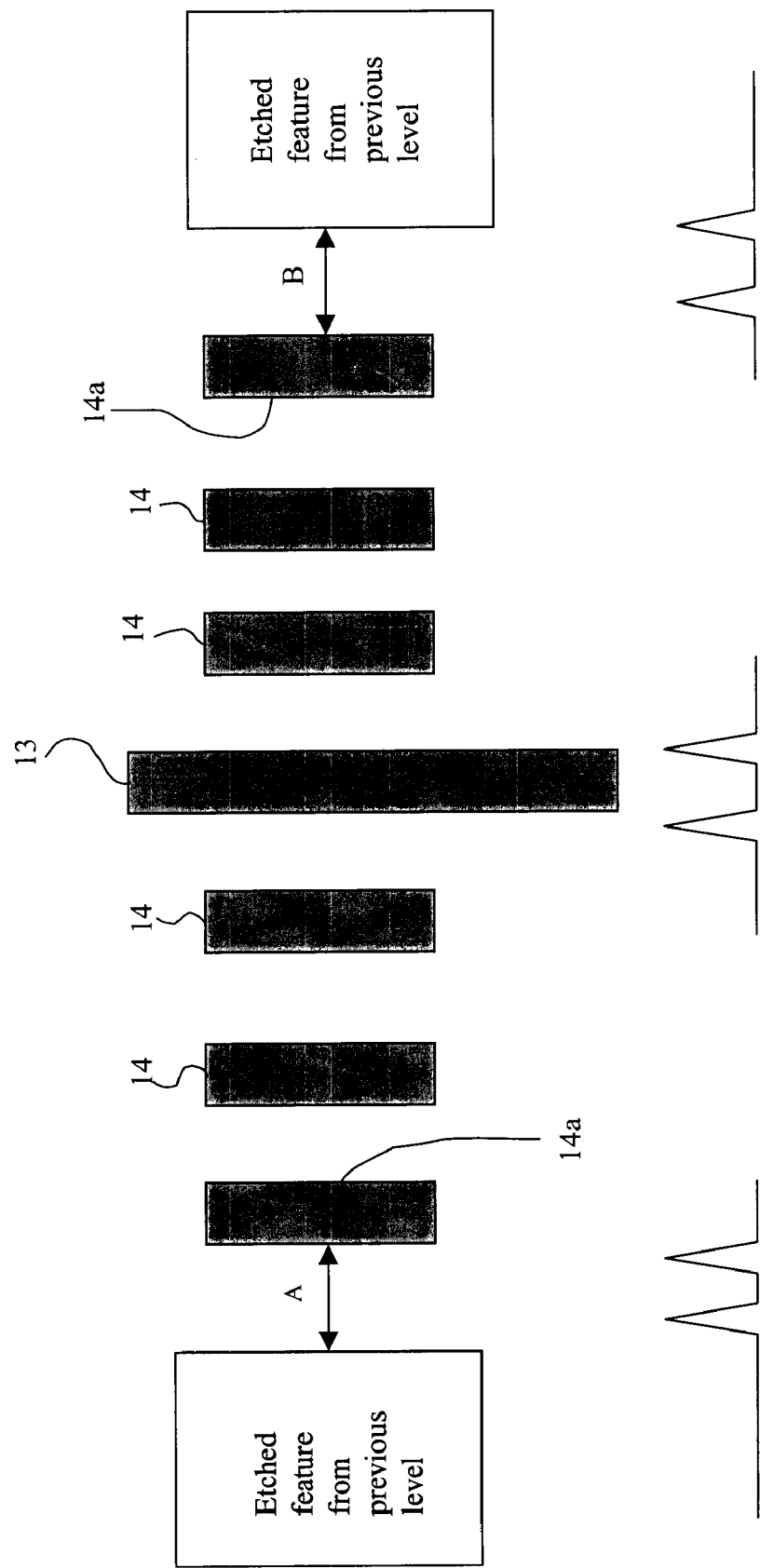
FIG. 2 is a conceptualized depiction of a diagram of the invention CD/overlay structure in which a single pass in SEM provides intensity data for both CD and overlay measurement along the X component.

The conceptualized depiction of the diagram of FIG. 2 shows the invention CD/overlay structure in which a single pass in SEM provides intensity data for both CD and overlay measurements in the X direction.

The diagram of FIG. 2 is a wafer metrology pattern that integrates overlay and critical dimension features and is disposed in the X direction, and the X overlay is calculated from the differences in distance between A and B. Alternatively, the Y overlay may be determined from the Y direction if the feature edges are rotated 90° to enable the Y overlay to be calculated. The center feature of section 13 provides a CD point on the X scan axis and this is significant because in modern lithography, the scanner scans along one axis only, and thereby provides the potential for CD differences between the scanned and not scanned directions. The spaces between the center feature 13 and a plurality of smaller adjoining sections 14 and 14a may be arranged or adjusted along the X scan axis in accordance with the design rules of the specific semiconductor application. Smaller adjoining sections 14a represent displacement lines positioned adjacent to smaller adjoining sections 14 to allow adjustment of the spaces between 14a and 14 in accordance with design requirements. An optimization of the wafer metrology pattern for ascertaining critical dimension analysis of a semiconductor configuration that combines overlay and critical dimension features using a single pass along a given axis in the CD SEM is readily achievable with this semiconductor wafer metrology pattern.

The graphs at the bottom of FIG. 2 depict output waveforms of the SEM for the device under test, and the waveform peaks provide an indication of the relative distance between the etched feature from a previous level and the current level of the structure, where the SEM output waveform is input to a critical dimension-scanning electron microscope (CD-SEM) algorithm to obtain an estimate of the critical dimension of the structure under test.

Accordingly, the present invention eliminates the overlay tool heretofore utilized or relied upon to determine overlay of the structure under test. Instead, the present invention uses a single pass in SEM to provide intensity data for both CD and overlay measurement in the X direction. Alternatively, the present invention may utilize a single pass in SEM to provide intensity data for both CD and overlay measurements in the Y direction.

In general, the method for determining the overlay and critical dimension of a semiconductor structure of the invention is accomplished by:

a) providing a semiconductor wafer structure in an overlay pattern, said semiconductor wafer structure in an overlay pattern comprising:
   a center feature section that provides a critical dimension point along a given axis;
   a plurality of smaller sections positioned adjacent to said center feature section along said given axis that include a plurality of spaces between each of the plurality of smaller sections; and
   said plurality of displacement lines adjacent to a plurality of said smaller sections to displace a plurality of spaces;

b) collecting a first measurement along said plurality of smaller sections positioned adjacent to said center feature section, said plurality of spaces and said plurality of displacement lines from a scanning electron microscope;

c) collecting a second measurement along a center feature section that provides a critical dimension point along said given axis from said scanning electron microscope;

d) establishing a relationship between said first measurement and said second measurement of said semiconductor wafer structure; and e) mapping a two dimensional waveform output corresponding to overlay and critical dimensional characteristics from an output of the scanning electron microscope to provides information on the overlay and critical dimension of the semiconductor wafer structure from said given axis; wherein steps b) and c) are performed in a single pass from said scanning electron microscope.

We claim:

1. A method for determining the overlay and critical dimension of a semiconductor structure in a single pass from a scanning electron microscope without use of an overlay tool, comprising:

a) providing a semiconductor wafer structure in an overlay pattern, said semiconductor wafer structure in an overlay pattern comprising:
   I) a center feature section that provides a critical dimension point along a given axis;
   II) a plurality of smaller sections positioned adjacent to said center feature section along said given axis that include a plurality of spaces between each of the plurality of smaller sections; and
   III) a plurality of displacement lines adjacent to a plurality of said smaller sections to displace a plurality of spaces;

b) collecting a first measurement along said plurality of smaller sections positioned adjacent to said center feature section, said plurality of spaces and said plurality of displacement lines, with a scanning electron microscope;

c) collecting a second measurement along a center feature section that provides a critical dimension point along said given axis with said scanning electron microscope;

d) establishing a relationship between said first measurement and said second measurement of said semiconductor wafer structure; and e) mapping a two dimensional waveform output corresponding to overlay and critical dimensional characteristics from an output of the scanning electron microscope to provide information on the overlay and critical dimension of the semiconductor wafer structure from said given axis; wherein steps b) and c) are performed in a single pass with said scanning electron microscope.

2. The method of claim 1 wherein said given axis is the X axis.

3. The method of claim 1 wherein said given axis is the Y axis.

4. The method of claim 3 wherein said center feature section is of greater length than said plurality of smaller sections.

5. The method of claim 4 wherein said plurality of displacement lines are of unequal dimensions.

6. The method of claim 2 wherein said wafer is rotated about 90° while scanning.

7. The method of claim 3 wherein said wafer is rotated about 90° while scanning.

8. The method of claim 6 wherein, subsequent to said rotation along the X axis, said wafer is rotated along the Y axis about 90° while scanning.

9. The method of claim 7 wherein, subsequent to said rotation along the Y axis, said wafer is rotated along the X axis about 90° while scanning.

* * * * *